United States Patent [19]

Bennett

[11] 3,906,381

[45] Sept. 16, 1975

[54] INTEGRATOR CIRCUIT AND LOW FREQUENCY TWO PHASE OSCILLATOR INCORPORATING SAME

[75] Inventor: Allan I. Bennett, Export, Pa.

[73] Assignee: Westinghouse Electric Corporation, Pittsburgh, Pa.

[22] Filed: Jan. 24, 1974

[21] Appl. No.: 436,279

[52] U.S. Cl. .................. 328/128; 307/230; 307/310

[51] Int. Cl.² .......................................... G06G 7/18

[58] Field of Search ........................... 307/228–230, 307/310; 328/127, 128, 142, 144, 181, 184

[56] References Cited

UNITED STATES PATENTS

| | | | |
|---|---|---|---|
| 3,178,698 | 4/1965 | Graham | 330/86 X |
| 3,475,601 | 10/1969 | Port | 307/229 X |
| 3,555,469 | 1/1971 | Harvey, Jr. | 328/127 X |

*Primary Examiner*—John Zazworsky
*Attorney, Agent, or Firm*—C. L. Menzemer

[57] ABSTRACT

The present disclosure provides a novel integrator circuit including an operational amplifier having first and second input terminals, said first input terminal being adapted for connection to a voltage source and including a resistor between said source and terminal. A first negative feedback loop including a capacitor is electrically connected between the output of the amplifier and the first terminal. A second positive frequency independent feedback loop is electrically connected between the output of the amplifier and the second input terminal. The second feedback loop preferably includes a voltage divider having a temperature variable resistor and a pair of independent heaters for varying the resistance of said resistor.

The low frequency oscillator includes a pair of the novel integrator circuits and a resistive inverter circuit electrically connected together in cascade having ganged gain control following each integrator.

2 Claims, 3 Drawing Figures

INTEGRATOR CIRCUIT AND LOW FREQUENCY TWO PHASE OSCILLATOR INCORPORATING SAME

FIELD OF THE INVENTION

The present invention relates to a novel integrator circuit and to a low frequency two-phase oscillator, and, in particular, to a low frequency two-phase oscillator in which the operational amplifiers each include a frequency independent feedback loop that includes a thermistor having two independent, electrically isolated heaters.

BACKGROUND OF THE INVENTION

Phase shift oscillators are well known in the art. The frequency of the oscillator is typically stabilized by a resistance capacitance ladder which gives the necessary delay (phase shift) in a feedback loop. It is also known that the conventional phase shift oscillators require at least three stages in order to sustain oscillation.

Thus, in a circuit including a pair of operational amplifier integrators of equal gain and a sign changer electrically connected in cascade with gain control between stages, sustained oscillation cannot be maintained. Circuit analysis of such a circuit where $e_1$ is the voltage into the first integrator and $e_2$ is the voltage into the second integrator provides:

$$(1) \quad e_2^\circ = \frac{-\alpha e_1}{\tau(1+A^{-1})} - \frac{e_2}{\tau(1+A)} = -ae_1 - be_2$$

$$(2) \quad e_1^\circ = \frac{\beta e_2}{\tau(1+A^{-1})} - \frac{e_1}{\tau(1+A)} = ce_1 - de_2$$

where $\tau = RC$, where $R$ is the resistance between the input voltage $e_1$ or $e_2$ and the operational amplifier, $C$ is the capacitance of the negative feedback loop of each amplifier connected from the output to between resistance R and the amplifier input; $A$ = operational amplifier gain; $e^o = de/dt$; and $\alpha$ and $\beta$ are the transmissions of attenuators in the outputs of each integrator.

Equations (1) and (2), which define $a,b,c$, and $d$, follow from the equation for the basic integrator circuit:

$$(3) \quad e_{out}^\circ = -\frac{e_{in}}{\tau(1+A^{-1})} - \frac{e_{out}}{\tau(1+A)}$$

Since an ideal integrator should have an output given by $$(4) \quad e_{out}^\circ = -\frac{e_{in}}{\tau},$$

the entire second term, $$\frac{e_{out}}{\tau(1+A)},$$

of equation (3) and the $A^{-1}$ of the first term represent sources of error. Both of these errors, however, approach zero as A becomes infinite.

For a positive finite A, the constants a,b,c and d in equations (1) and (2) are all positive. The equations also assure that the sign changer is ideal, that is, $e_3 = -e_1$ which can be attained by making $$\frac{R_3}{r} = \frac{A-1}{A+1}$$

Under these conditions, the solutions of equations (1) and (2) are given by:

$$(5) \quad e_1 = \exp\left[-\frac{t}{2}(b+c)\right] \left[\left(\frac{2d}{m}e_{20} + \frac{b-c}{m}e_{10}\right)\sinh\frac{mt}{2} + e_{10}\cosh\frac{mt}{2}\right]$$

$$(6) \quad e_2 = \exp\left[-\frac{t}{2}(b+c)\right] \left[-\left(\frac{2a}{m}e_{10} - \frac{b-c}{m}e_{20}\right)\sinh\frac{mt}{2} + e_{20}\cosh\frac{mt}{2}\right]$$

where $m = [(b+c)^2 - 4ad]^{1/2}$ and $e_{10}$ and $e_{20}$ are the initial values of $e_1$ and $e_2$ at $t = 0$. In order for $e_1$ and $e_2$ to be periodic it is necessary that $m^2$ be negative and that $b+c = 0$; and, for sustained sinusoidal oscillation it is necessary that $b = c = 0$. However, for a finite A, $b$ and $c$ cannot be equal to zero since each is equal to $$\frac{1}{\tau(1+A)}.$$

Accordingly, a circuit having a pair of integrator circuits as described above and a sign changer in cascade, cannot be made to give sustained oscillations where A is finite. Any initial value of voltages $e_{10}$ and $e_{20}$ results in a damped oscillation where the damping time constant is $\theta$ and is equal to $2/(b+c) = \tau(1+A)$. The number of cycles during the time constant is $$N = \frac{A(\alpha\beta)^{1/2}}{2\pi},$$

and since $\alpha$ and $\beta$ are less than one, the number of cycles during the damping time constant is less than $A/2\pi$.

A further problem in oscillator control is that the sensor means, typically a thermistor, used for amplitude control is activated not by the amplitude of the output but rather by the instantaneous output voltage. Thus, at low frequencies, the sensor follows the cyclic variations of the output providing waveform distortions. This behavior normally limits the operating frequency to value high compared to the reciprocal of the sensor response time.

Accordingly, it is an object of the present invention to provide an oscillator circuit having a pair of integrators in which the gain appears to be infinite in order to provide sustained oscillation in the oscillator circuit. A further object of the present invention is to provide amplitude control without waveform distortion to permit low-frequency operation at frequencies down to and including zero.

SUMMARY OF THE INVENTION

The present invention provides a low-frequency sinusoidal oscillator that provides a two-phase output the frequency of which can be zero. The present invention also provides a two-phase low-frequency oscillator which can be stopped in mid-cycle to hold the output at a fixed value at the instant the system is stopped and to begin again from these fixed values.

Generally, the present invention comprises a pair of integrator circuits and a sign changer, a resistive inverter amplifier, in cascade with ganged gain controls following each integrator. Each of the integrator circuits comprises a double-input operational amplifier and a frequency independent positive feedback loop connected to the second input terminal of the amplifier. The effect of the frequency independent feedback loop is to provide sustained sinusoidal oscillations of frequency $\omega = \alpha/\tau$, where $\alpha$ is the transmission of each gain control. Thus, the ganged gain controls between stages control the frequency of output which is linearly proportional to the gain control setting.

Each of the frequency independent feedback loops includes a thermistor for amplitude or drift control. The thermistor, however, includes first and second independent and electrically isolated heaters. The first heater is responsive to the oscillator sine output and the second heater is responsive to the oscillator cosine output. Amplitude stability against drift of circuit parameters with time is provided by making the gain $\beta$ of the operational amplifier relative to the frequency independent feedback loop dependent upon the resistance of the thermistor that is heated by the two electrically separate heaters connected to $e_1$ and $e_2$, respectively. Thus, if the voltages deviate from their prescribed values, the resulting deviation will cause those voltages to return to the prescribed value. The utilization of two heaters connected to sinusoidal voltages in quadrature results in a thermistor total heat power that depends upon the oscillation amplitude, because $\sin^2 + \cos^2 = 1$, rather than upon the instantaneous values of $e_1$ and $e_2$ which values vary during the cycle.

First and second buffer amplifiers are preferably utilized in the oscillator of the present invention to isolate the integrators from the loading effects of the thermistor heaters and the output circuits.

Other advantages of the present invention will become apparent from a perusal of the following detailed description of a presently preferred embodiment taken in connection with the accompanying drawings.

PRESENTLY PREFERRED EMBODIMENTS

Figure 1:
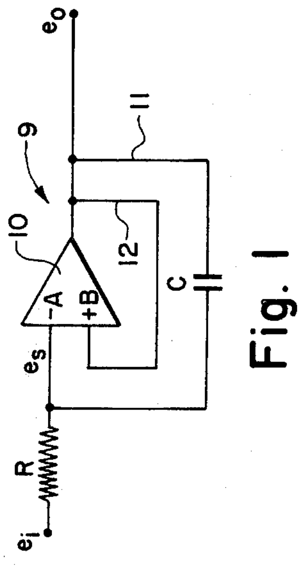
FIG. 1 is a diagram of the integrator circuit of the present invention.

With reference to FIG. 1, the integrator circuit 9 of the present invention comprises an operational amplifier 10 having first and second input terminals and an output terminal. The gain from the first input terminal to the output terminal is −A and gain from the second input terminal to the output terminal is +B, where A and B are both positive.

Circuit 9 includes a conventional frequency dependent feedback loop 11 having a capacitance C and which is connected to the first input terminal of amplifier 10. A positive frequency-independent feedback loop 12 is provided that is connected to the second input terminal. Circuit 9 also includes resistance R. The voltage into integrator circuit 9 is designated $e_i$ and voltage out is designated $e_o$, where $e_o$ is equal to $-Ae_A + Be_B$.

With integrator circuit 9 of FIG. 1 it is possible to formally make A infinite by means of frequency independent feedback loop 12. Thus, the circuit is described by the equation:

$$(7) \quad e_o^{\circ} = \frac{-e_i}{\tau\left(1+\frac{\delta}{A}\right)} - \frac{e_o}{\tau\left(1+\frac{A}{\delta}\right)} \quad \text{where } \delta = 1-B.$$

The effect of the additional positive feedback from loop 12 is to replace A in the previously described equation (3) of an integrator circuit with A/δ. Making B = 0 or δ = 1−B = 1 provides a conventional circuit with no additional feedback. The coefficients of $e_i$ and $e_o$ in equation (7) are smooth and continuous functions of δ for all values of δ from 1 to −A. In the preferred embodiment, however, the integrator operates at very small values of δ, for example, δ = 0 or B = 1. When δ = 0 in equation (7), the result is formally equivalent to making A, in equation (3) infinite resulting in a relation identical to the ideal integrator of equation (4). Accordingly, by the addition of positive feedback loop 12, both error terms in equation (3) are eliminated.

In an oscillator circuit having a pair of integrator circuits 9 and a resistive inverter amplifier in cascade with ganged gain control between stages, it then follows that in equations (5) and (6) $b = c = 0$, and a sustained sinusoidal oscillation of frequency $\omega = \alpha/\tau$ (where $\alpha = \beta$, i.e., both integrators are the same) results. The amplitude of the oscillation will increase or decrease with time according to whether δ is positive or negative. It is this effect which is used to stabilize the circuit against drift.

Figure 2:
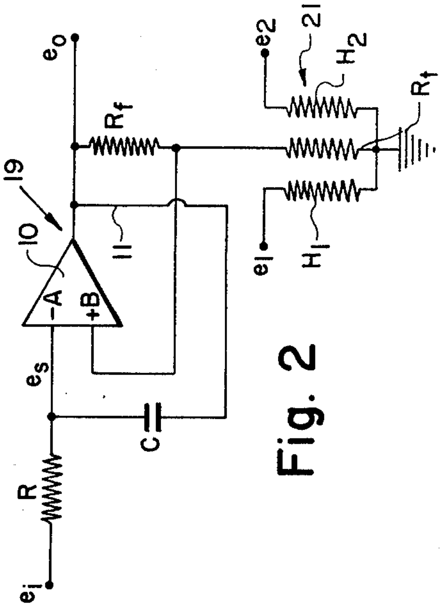
FIG. 2 is a diagram of the integrator circuit of the present invention will voltage-controlled positive feedback.

With reference to FIG. 2, integrator circuit 19 includes a thermistor 21, the resistance $R_T$ of which is used to stabilize the amplitude of the circuit. Thermistor 21 is indirectly heated by first and second heaters $H_1$ and $H_2$, which are connected to voltages $e_1$ and $e_2$, respectively. Thus, if $e_1$ and $e_2$ deviate from a value which makes δ = 0, the resulting nonzero value of δ will cause $e_1$ and $e_2$ to return to the desired amplitude at which it is equal to zero. The use of the independent heaters $H_1$ and $H_2$ which are connected in the oscillator of the present invention to sinusoidal voltages in quadrature results in a total heater power for thermistor 21 which depends on the oscillation amplitude, because $\sin^2 + \cos^2 = 1$, rather than the instantaneous values of $e_1$ and $e_2$. Heater power, therefore, stays constant during the cycle to avoid any waveform distortion.

Generally, the manner in which δ is made to vary with the output amplitude to stabilize it depends upon the particular integrator circuit. Since the signs of the first and second feedback loops 11 and 12 are opposite, a differential-input (two input circuits of opposite polarity) amplifier is typically required as shown in FIG. 2. However, to vary δ with output amplitude $e$, it is required that δ = 0 or B = 1 at some value of $e$ and that δ > 0 (or B < 1) for $e$ > E while δ < 0(B > 1) for $e$ < E, where E is the equilibrium value of the amplitude of oscillation. One means for achieving this is shown in FIG. 2 in which voltage divider is used having a fixed resistor $R_f$ and a negative-temperature coefficient thermistor 21 of resistance $R_T$ is inserted in feedback loop 12. As the heater power (proportional to $e^2 = e_1^2$ $+ e_2^2$) is increased, the temperature of thermistor 21 is increased and its resistance $R_T$ is decreased to increase $\delta$. Thus a smaller fraction $$\frac{R_T}{R_f+R_T}$$

of $e_o$ is returned to input terminal B of amplifier 10 to decrease $\delta$. Conversely, as the heater power is decreased, the temperature of thermistor 21 is decreased with a resulting increase in resistance $R_T$ and a decrease in $\delta$.

The attenuation of the voltage divider requires an increase in B to make the gain of the frequency independent feedback loop 12 unity. In this case, therefore, $$\delta = 1 - \frac{BR_T}{R_f+R_T}$$

Thus, there are values for B, $R_f$ and $R_T$ that result in a $\delta(e)$ such that for some $e = E$, $\delta(E) = 0$, and that $\delta$ will vary with e as described.

Figure 3:
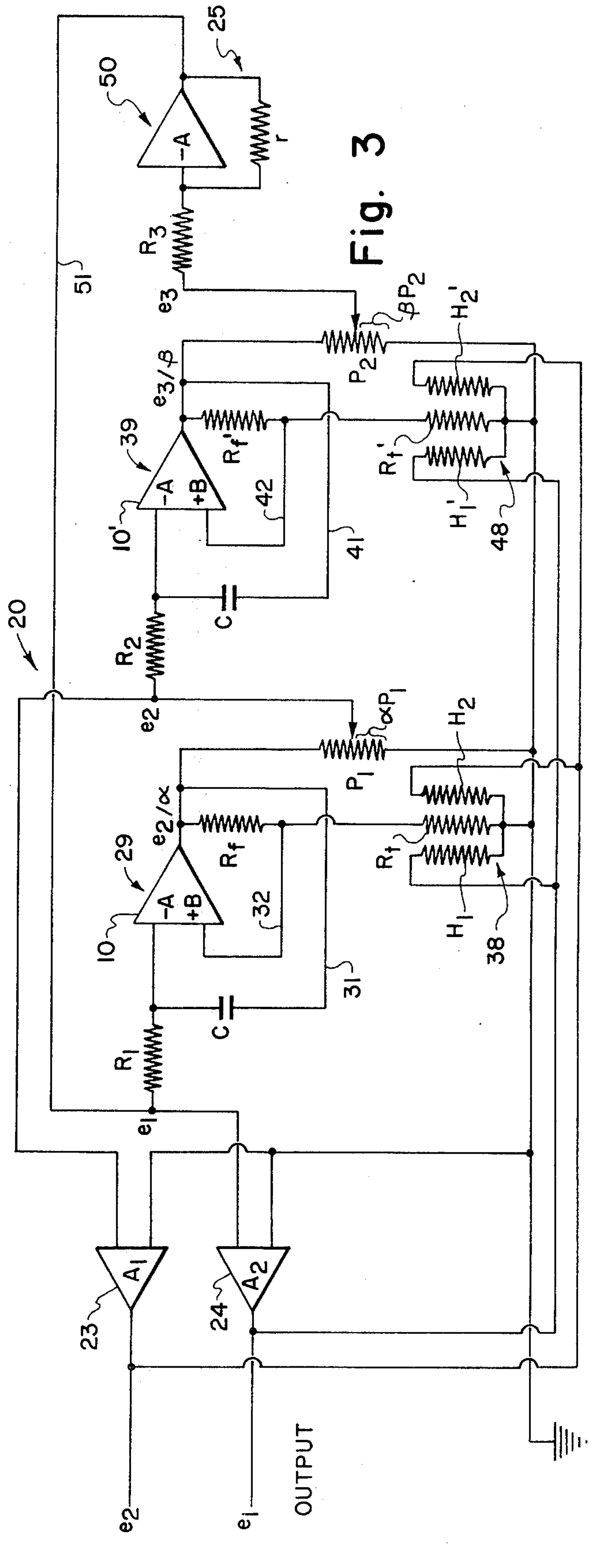
FIG. 3 is a diagram of a low-frequency two-phase oscillator circuit of the present invention utilizing voltage-controlled feedback integrators shown in FIG. 2.

Referring to FIG. 3, a low-frequency, two-phase oscillator circuit 20 is shown. Oscillator circuit 20 includes first and second integrator circuits 29 and 39 as described with reference to FIG. 2. Circuit 20 also includes a resistive inverter circuit 25. The two integrators 29 and 39 each contribute phase shifts of 90° and sign changer 25 provides a phase shift of 180° to supply the total 360° required for oscillation.

First integrator circuit 29 includes a frequency dependent negative feedback loop 31 having a capacitor C connected to input —A of operational amplifier 10. Circuit 29 also includes a second frequency independent positive feedback loop 32 connected to second input terminal B of operational amplifier 10 and includes a voltage divider comprising a fixed resistance $R_f$ and a sensing means 38. Sensing means 38 preferably comprises a negative temperature coefficient thermistor $R_T$ and a pair of independent heaters $H_1$ and $H_2$. Heaters $H_1$ and $H_2$ are electrically connected to output voltages $e_1$ and $e_2$, respectively.

Second integrator 39 includes operational amplifier 10' connected to said first integrator circuit 29 through first gain control means $P_1$ and through resistor $R_2$ to input terminal —A of amplifier 10'. Second integrator circuit 39 also includes a first frequency dependent feedback loop 41 and a second frequency independent feedback loop 42. First feedback loop 41 includes capacitor C and second feedback loop 42 includes a voltage divider having fixed resistor $R_f'$, and sensing means 48. Sensing means 48 comprises negative temperature coefficient thermistor $R_T'$ and heaters $H_1'$ and $H_2'$ electrically connected to $e_1$ and $e_2$, respectively.

The output of second integrator circuit 39 is connected to ground through second gain control means $P_2$. The output of second gain control means $P_2$ is connected through resistor $R_3$ to the input of resistive input amplifier 50. Feedback loop 51 is connected from the output of amplifier 50 to resistor $R_1$ connected to first input terminal —A of operational amplifier 10. First and second buffer amplifiers 23 and 24 are included in oscillator circuit 20 to isolate integrator circuits 29 and 39 from the loading effect of thermistor heaters $H_1$, $H_1'$ and $H_2$, $H_2'$ of thermistors 38 and 48, respectively.

In the operation of the oscillator of the present invention, frequencies as low as a cycle per several minutes have been obtained with excellent waveform. In the higher frequency ranges, the frequency response of the first feedback loops, i.e., to the —A input of the operational amplifiers, must not be permitted to fall to a value which is low in relation to that of the second feedback loop, i.e., to the B input terminal. As long as the absolute value of A is considerably greater than the absolute value of B, e.g., A $\geq$ 10B, both are affected similarly by drift, and the use of the second positive feedback has negligible effect on stability in the system against changes in gain.

Furthermore, in certain low-frequency applications, it is desirable to avoid the time required for the output amplitude to reach the equilibrium value. This can be achieved by precharging both capacitors C in integrator circuits 29 and 39 to voltages $e_1$ and $e_2$ such that $e_1^2 + e_2^2 = E^2$, where E is the equilibrium value of amplitude of oscillation. In this case, the oscillation begins with the initial conditions compatible with equilibrium, and no transient occurs.

While presently preferred embodiments of the invention have been shown and described in particularity, it may be otherwise embodied within the scope of the appended claims.

What is claimed is:

1. An integrator circuit comprising an operational amplifier having first and second input terminals and an output, said first terminal being adapted for connection with an input voltage source and including a resistor between said input source and first terminal; a first negative feedback loop connected between said output terminal and said first input terminal, said first feedback loop including a capacitor, and a second positive feedback loop connected between said output terminal and said second input terminal, said second feedback loop including a voltage divider having first and second resistors, said second resistor being a temperature variable resistor and including a pair of electrically isolated heaters for varying the resistance of said second resistor.

2. An integrator circuit as set forth in claim 1 wherein said second resistor is selected from the group consisting of a positive temperature coefficient thermistor and a negative temperature coefficient thermistor.

* * * * *